United States Patent [19]

Muratani et al.

[11] Patent Number: 4,862,104
[45] Date of Patent: Aug. 29, 1989

[54] PHASE SYNCHRONIZATION SYSTEM

[75] Inventors: Takuro Muratani, Yokohama; Hideo Kobayashi; Toshinari Kimura, both of Tokyo, all of Japan

[73] Assignee: Kokusai Denshin Denwa Kabushiki Kaisha, Tokyo, Japan

[21] Appl. No.: 296,897

[22] Filed: Jan. 12, 1989

Related U.S. Application Data

[63] Continuation of Ser. No. 178,125, Apr. 6, 1988, abandoned.

[30] Foreign Application Priority Data

Apr. 8, 1987 [JP] Japan ............................ 62-84852

[51] Int. Cl.$^4$ .......................... H03L 7/00; H03L 7/06
[52] U.S. Cl. ................................... 331/1 A; 331/17; 375/120
[58] Field of Search ............... 331/1 A, 17, 18, 23, 331/25, 30; 375/97, 119, 120

[56] References Cited

U.S. PATENT DOCUMENTS 4,561,099 12/1985 Atsugi et al. .................... 375/97

Primary Examiner—David Mis
Attorney, Agent, or Firm—Emmanuel J. Lobato; Robert E. Burns

[57] ABSTRACT

A phase synchronization circuit for processing a received signal, the phase of which is detected by a first reference carrier from a fixed oscillator and a second reference carrier orthogonal to the first reference carrier. Two baseband signals are thus obtained and sampled with a certain period. Converters convert these two signals into digital values. Phase and amplitude values at each sample point are obtained from these digital values orthogonal to each other. The frequency and phase differences between the received signal and each of the first and second reference carriers are estimated by an optimization method by utilization of pluralities of phase and amplitude data obtained with a fixed period of time. The voltage-controlled oscillator and the phase shifter are controlled with the estimated values for generating a recovered carrier of a phase synchronized with the received signal. A circuit is provided in which the hysteresis of frequency and phase differences are stored at the time of current estimation. The stored values and currently-estimated values are compared with each other. On the basis of the results of the comparison of these values, the received signal is analogized. The numbers of data samples for use in the estimation of the frequency and phase differences are made variable according to the result analogy, thereby achieving an optimum phase synchronization in accordance with the state of the received signal.

10 Claims, 5 Drawing Sheets

PHASE SYNCHRONIZATION SYSTEM

This is a continuation of application Ser. No. 178,125, filed Apr. 6, 1988, now abandoned.

BACKGROUND OF THE INVENTION

1. Technical Field of the Invention

The present invention relates to a phase synchronization system which follows the frequency and the phase of an input signal.

2. Prior Art and Its Problem

Heretofore a phase synchronization circuit of the PLL (Phase Locked Loop) system has widely been used, for example, in a carrier recovery circuit for creating a reference carrier necessary for demodulating a phase-modulated signal and a frequency tracking circuit for tracking a certain electric wave. The frequency and phase pull-in characteristics of the phase synchronization circuit of the PLL system depend on an equivalent noise band width (a loop band width) which is determined by a loop gain and characteristics of a loop filter and a phase comparator. An increase in the loop band width will quicken the occurrence of the pull-in operation and a decrease in the loop band width will defer the occurrence of the pull-in operation. However, when the loop band width is large, an output phase jitter in the steady state is large, whereas when the loop band width is narrow the jitter is small.

In general, a phase synchronization circuit is required to have a quick pull-in characteristic and to be small in the phase jitter in the steady state, but these two requirements are contradictory to each other, as mentioned above.

An example of the prior art for solving this problem has been employed in a carrier recovery circuit of the TDMA communication system. Since a TDMA signal is composed of a plurality of asynchronous burst signals, its demodulation calls for a demodulating operation which takes place while generating a reference carrier for each burst signal, and the carrier recovery circuit needs to be capable to establishing synchronization in a very short period of time.

Furthermore, since the TDMA signal is generally high in transmission rate, it is required that the phase jitter in the steady state be very small. To meet this requirement, the carrier recovery circuit is controlled so that in the pull-in state it increases the loop gain to widen the loop band to quicken the pull-in operation and in the steady state it decreases the loop gain to narrow the loop band to reduce the phase jitter.

Figure 1A:
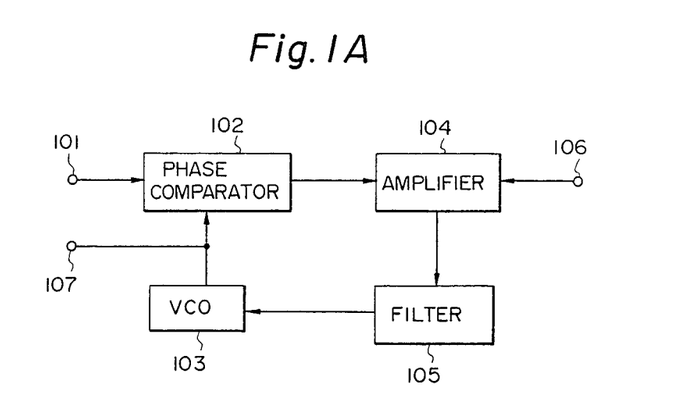
FIG. 1(a) is a block diagram illustrating a conventional phase synchronization circuit of the PLL system.
Figure 1B:
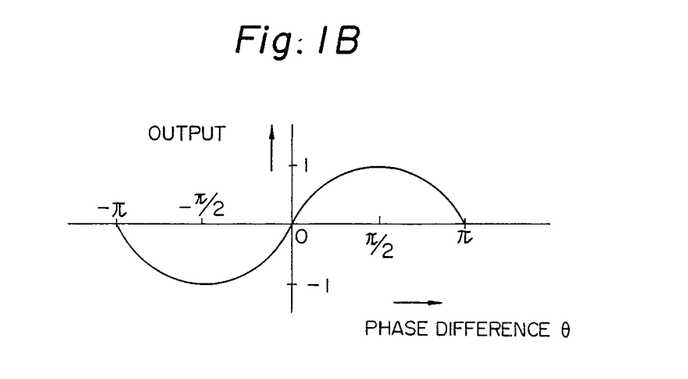
FIG. 1(b) is a graph illustrating the phase comparison characteristic of the conventional phase synchronization circuit in FIG. 1(a)

FIG. 1 shows an example of the constitution of the above-said prior art. In FIG. 1(a) reference numeral 101 indicates a signal input terminal, 102 a phase comparator, 103 a VCO (Voltage-Controlled Oscillator), 104 an amplifier, 105 a loop filter, 106 a timing signal input terminal, and 107 an output terminal. FIG. 1(b) shows the phase comparison characteristic of the phase comparator 102, the abscissa representing the phase difference $\theta$ between the input signal and the output signal from the VCO 103 and the ordinate the output voltage.

The prior art example shown in FIG. 1 operates in the following manner. The phase comparator 102 outputs, as a voltage, the difference in phase between the input signal and the output signal from the VCO 103. This voltage is applied via the amplifier 104 and the loop filter 105 to the VCO 103, controlling it so that the frequency and the phase of its oscillation signal approach the frequency and the phase of the input signal. The amplifier 104 is to adjust the loop gain for changing the loop band width, depending on whether the circuit performs the pull-in or steady-state operation, as referred to previously. The amplification degree of the amplifier is controlled by a timing signal which is separately detected and applied to the terminal 106.

This system has a defect of needing, for changing the loop band width, timing information as to when the pull-in operation is to be started and when the steady state has been restored. This necessitates the use of a circuit for detecting the timing and generating the timing information, and hence introduces complexity in the apparatus.

On the other hand, the phase synchronization circuit of the PLL system suffers also the degradation of the phase pull-in characteristic which is commonly referred to as a hang-up phenomenon, and difficulty has been encountered in employing this circuit in a case where phase synchronization must be established in a short period of time.

The hang-up phenomenon refers to a state in which when the phase difference between the input signal 101 and the output signal of the VCO 103 at the terminal 107 is $\pi$, the output of the phase comparator 102 becomes zero and the phase of oscillation of the VCO 103 undergoes no change, with the result that the phase difference settles into $\pi$, making it impossible to establish synchronization as will be seen from the phase comparison characteristic shown in FIG. 1(b). Moreover, when the phase difference is not exactly equal to $\pi$ but very close to $\pi$, a phenomenon occurs which can be regarded as the hang-up phenomenon; in this case, the output of the phase comparator 102 becomes close to zero and much time is needed for establishing synchronization.

A method which prevents this hang-up phenomenon and improves the pull-in characteristic is set forth in a literature entitled "Studies of Carrier Recovery Circuit for Use in Synchronous Demodulation of TDMA Signal" (Journal of Institute of Electronics and Communication Engineers of Japan, Vol. 54-B, No. 4, 1971, pp. 160-167). This method is called a kick off system, according to which the phase difference is measured at the start of synchronization and if the phase difference is close to $\pi$, the phase difference is forcibly shifted by $\pi$ from a hang-up region (near $\pi$) to a stable region (near zero). This system also has the drawback that information on the starting timing for synchronization operation is needed for operation, as is the case with the system which employs different loop gains for the pull-in operation and the steady-state operation. Besides, according to this system, when the input signal contains noise, there are cases where the hang-up phenomenon cannot be detected or the noise is detected as the hang-up phenomenon; namely, this system suffers so-called nondetection and erroneous detection, and hence cannot yet completely eliminate the hang-up phenomenon.

SUMMARY OF THE INVENTION

An object of the present invention is to provide a phase synchronization system which obviates the above-mentioned defects of the conventional phase synchronization systems and which is free from the hang-up phenomenon and permits very rapid synchronization of a plurality of a synchronous burst signals even if they greatly differ in frequency as in the case of the TDMA signal.

The present invention has its feature in that instead of using c phase comparator which causes the hang-up phenomenon, the received signal is detected directly by two orthogonal reference carriers, the baseband signals thus obtained are digitally processed, and the frequency and phase differences between the received signal and each of the reference carriers are estimated by use of an optimization method, for performing the phase synchronization.

To enable high-speed, high-stability synchronization, the loop includes a memory, by which it is determined whether the circuit is in the pull-in operation or steady-state operation. This permits high-speed phase synchronization in the pull-in operation and high-stability phase synchronization with a small phase jitter in the steady-state operation.

According to the present invention, no hang-up phenomenon will occur and a rapid and highly stable pull-in can be achieved even for TDMA signals with large frequency deviations. Furthermore, since the present invention is implemented by digital processing, the characteristic of its circuit can easily be changed unlike in the case of an analog circuit, and accordingly an optimum precision for phase synchronization can easily be set in view of the condition of the transmission line.

DESCRIPTION OF THE PREFERRED EMBODIMENTS

With reference to the accompanying drawings embodiments of the present invention will hereinafter be described in detail.

Figure 2:
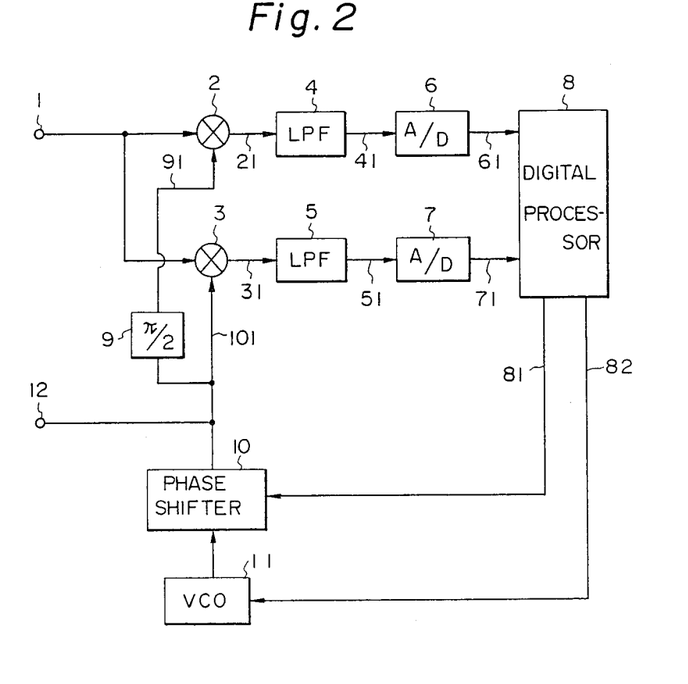
FIG. 2 is a block diagram illustrating an example of a feedback type phase synchronization circuit of the present invention.

FIG. 2 illustrates a first embodiment of the present invention, which is a feedback type circuit. Reference numeral 1 indicates an input signal terminal, 2 and 3 multipliers, 4 and 5 low-pass filters (EPFs), 6 and 7 analog-to-digital converters (A/Ds), 8 a digital calculator, 9 a $\pi/2$ phase shifter, 10 a variable phase shifter, 11 a VCO (a Voltage-Controlled Oscillator), and 12 a recovered carrier output terminal. Now let it be assumed that when an input signal to the input terminal 1 has been modulated, it is input after having its modulated component removed. Provided that the received signal S(t) is an undemodulated signal, then it is expressed, in general, by the following expression:

$$S(t) = \sqrt{2}\ A\cos\theta(t) + n(t) \tag{1}$$

In expression (1), A represents the amplitude level of the received signal and $\theta(t)$ and n(t) represent a phase component and a noise component of the received signal, respectively, which are given by the following expressions:

$$\theta(t) = \omega_0 t + \Delta\omega t + \theta \tag{2}$$

where $\omega_0$ represents a reference angular frequency of the received signal, $\Delta\omega$ an angular frequency deviation of the received signal from a reference carrier and $\theta$ the initial phase of the received signal.

$$n(t) = \sqrt{2}\ n_1(t)\cos\theta(t) + \sqrt{2}\ n_2(t)\sin\theta(t) \tag{3}$$

where $n_1(t)$ and $n_2(t)$ are Gaussian noise components which are orthogonal to each other and whose mean value is 0. The circuit depicted in FIG. 2 is intended to estimate, with high precision, the phase component $\theta(t)$ from the received signal S(t) and regenerate a signal synchronized therewith.

Now, a description will be given first of the basic operation of this circuit and then of synchronization of asynchronous burst signals as of the TDMA signal. The received signal S(t) is applied to multipliers 2 and 3, in which it is multiplied by signals 91 and 101 which are orthogonal to each other. The signals 101 and 91 are expressed by the following expressions:

$$e_1(t) = \sqrt{2}\ \cos\theta_1(t) \tag{4}$$

$$e_2(t) = \sqrt{2}\ \sin\theta_1(t) \tag{5}$$

where $\theta_1(t)$ is composed of the angular oscillation frequency $\omega_0'[=\omega_0+\Delta\hat{\omega}_0]$ and a phase deviation $\hat{\theta}_0$ which is controlled by the phase shifter 10, and is expressed by the following expression:

$$\theta_1(t) = \omega_0 t + \Delta\hat{\omega}_0 t + \hat{\theta}_0 \tag{6}$$

where $\Delta\hat{\omega}_0$ and $\hat{\theta}_0$ are frequency and phase differences estimated by the digital processor 8. In the following description, let it be assumed that these two values start in the initial state, that is, they start with zero.

Output signals 21 and 31 from the multipliers 2 and 3 are applied to the LPFs 4 and 5, in which high-frequency components are removed from them. Output signals 51 and 41 from the LPFs 5 and 4 are such as expressed by the following expressions:

$$y_1(t) = \eta(t) \cos \xi(t) \tag{7}$$

$$y_2(t) = \eta(t) \sin \xi(t) \tag{8}$$

where:

$$\eta(t) = \sqrt{\{A + n_1(t)\}^2 + n_2^2(t)} \tag{9}$$

$$\xi(t) = \theta(t) - \theta_1(t) - \phi(t) \tag{10}$$

-continued
$$\phi(t) = \tan^{-1}\left(\frac{n_2(t)}{A + n_1(t)}\right) \quad (11)$$

The signals expressed by expressions (7) and (8) are sampled with a timing period T and are converted by the A/D converters 6 and 7 into digital form. Output signals 71 and 61 from the A/D converters 7 and 6 in i-th sampling are expressed by the following expressions:

$$X_i = \eta_i \cos \xi_i \quad (12)$$

$$Y_i = \eta_i \sin \xi_i \quad (13)$$

where:

$$\eta_i = \sqrt{\{A + n_1(t_i)\}^2 + n_2^2(t_i)}$$

$$\xi_i = \theta(t_i) - \theta_1(t_i) - \phi(t_i)$$

$$\phi_i = \tan^{-1}\left(\frac{n_2(t_i)}{A + n_1(t_i)}\right)$$

$$t_i - t_{i-1} = T$$

The digital processor 8 estimates the phase component $\theta(t)$ of the received signal by performing the following calculations using $X_i$ and $Y_i$.

At first, calculations of expressions (14) and (15) are performed using $X_i$ and $Y_i$ at each input sample point, thereby obtaining $\eta_i$ and $\xi_i$.

$$\eta_i = \sqrt{X_i^2 + Y_i^2} \quad (14)$$

$$\xi_i = \tan^{-1}\left(\frac{Y_i}{X_i}\right) \bmod(2\pi) \quad (15)$$

$\xi_i$ expressed by expression (15) can be obtained only as the principal value in the range $-\pi \leq \xi_i \leq \pi$.

Accordingly, a net amount of angular rotation $A_i$ at each sample point is obtained by the following operation:

$$A_i = \xi_0 + \sum_{j=1}^{i}(\xi_j - \xi_{j-1}) \quad (16)$$

In this case, the relationship given by the following expression holds between $A_i$ and $\xi_i$.

$$A_i(\bmod 2\pi) = \xi_i \quad (17)$$

By using the relationship of expression (17), expressions (12) and (13) become as follows:

$$X_i = \eta_i \cos A_i \quad (18)$$

$$Y_i = \eta_i \sin A_i \quad (19)$$

Next, a description will be given of a method for estimating the angular frequency deviation $\Delta\omega$ and the phase component $\theta$ of the received signal by using expressions (18) and (19). For the sake if convenience, $\Delta\hat{\omega}_1$ and $\hat{\theta}_1$ are set for $\Delta\omega$ and $\theta$ to be estimated. Using $\Delta\hat{\omega}_1$ and $\hat{\theta}_1$, expressions (18) and (19) are transformed as follows:

$$X_{ei} = \eta_i \cos(A_i - \Delta\hat{\omega}_1 t_i - \hat{\theta}_1) \quad (20)$$

$$Y_{ei} = \eta_i \sin(A_i - \Delta\hat{\omega}_1 t_i - \hat{\theta}_1) \quad (21)$$

Next, consider the following operation for N samples from $t_0$ to $t_{N-1}$.

$$\hat{X}_{eN} = \sum_{k=0}^{N-1} \eta_k \cos(A_k - \Delta\hat{\omega}_1 t_k - \hat{\theta}_1) \quad (22)$$

$$\hat{Y}_{eN} = \sum_{k=0}^{N-1} \eta_k \sin(\theta_k - \Delta\hat{\omega}_1 t_k - \hat{\theta}_1) \quad (23)$$

As will be evident from the relationships of expressions (22) and (23), when $\hat{X}_{eN}$ assumes a maximum value or when $\hat{Y}_{eN}$ assumes a minimum value, $\Delta\omega$ and $\theta$ are most accurately estimated in terms of $\Delta\hat{\omega}_1$ and $\hat{\theta}_1$.

Accordingly, the estimation of $\Delta\omega$ and $\theta$ comes does to a problem of obtaining $\Delta\hat{\omega}_1$ and $\hat{\theta}_1$ when $\hat{X}_{eN}$ becomes maximum (or when $\hat{Y}_{eN}$ becomes minimum).

$\Delta\hat{\omega}_1$ and $\hat{\theta}_1$ for maximizing $\hat{X}_{eN}$ can be obtained as follows, using a calculus of variations which is one iof optimization methods.

At first, expression (22) is partially differentiated as functions of $\Delta\hat{\omega}_1$ and $\hat{\theta}_1$.

$$\frac{\partial X_{eN}(\Delta\hat{\omega}_1, \hat{\theta}_1)}{\partial \Delta\hat{\omega}_1} = \sum_{k=0}^{N-1} \eta_k t_k \sin(A_k - \Delta\hat{\omega}_1 t_k - \hat{\theta}_1) \quad (24)$$

$$\frac{\partial X_{eN}(\Delta\hat{\omega}_1, \hat{\theta}_1)}{\partial \hat{\theta}_1} = \sum_{k=0}^{N-1} \eta_k \sin(A_k - \Delta\hat{\omega}_1 t_k - \hat{\theta}_1) \quad (25)$$

In this case, $\Delta\hat{\omega}_1$ and $\hat{\theta}_1$ for maximizing $\hat{X}_{eN}$ are solutions when expressions (24) and (25) become zero.

On the other hand, if $\Delta\omega \approx \Delta\hat{\omega}_1$ and $\theta \approx \hat{\theta}_1$, then the relationship of the following expression will hold:

$$\sin(A_k - \Delta\hat{\omega}_1 t_k - \hat{\theta}_1) \approx A_k - \Delta\hat{\omega}_1 t_k - \hat{\theta}_1 \quad (26)$$

By solving the simultaneous equations (24) and (25) through use of the relationship of Eq. (26), $\Delta\hat{\omega}_1$ and $\hat{\theta}_1$ can be obtained as follows:

$$\Delta\hat{\omega}_1 = \frac{\sum_{k=0}^{N-1}\eta_k \sum_{k=0}^{N-1}\eta_k t_k A_k - \sum_{k=0}^{N-1}\eta_k t_k \sum_{k=0}^{N-1}\eta_k A_k}{\sum_{k=0}^{N-1}\eta_k \sum_{k=0}^{N-1}\eta_k t_k^2 - \left(\sum_{k=0}^{N-1}\eta_k t_k\right)^2} \quad (27)$$

$$\hat{\theta}_1 = \frac{\sum_{k=0}^{N-1}\eta_k \sum_{k=0}^{N-1}\eta_k t_k^2 - \sum_{k=0}^{N-1}\eta_k t_k \sum_{k=0}^{N-1}\eta_k t_k A_k}{\sum_{k=0}^{N-1}\eta_k \sum_{k=0}^{N-1}\eta_k t_k^2 - \left(\sum_{k=0}^{N-1}\eta_k t_k\right)^2} \quad (28)$$

In Eqs. (27) and (28), $t_k$ is the time for the sake of convenience, as indicated in Eqs. (20) and (21). Accordingly, consider that $t_k = kT$.

Substituting the above-mentioned relations into Eqs. (27) and (28), $\Delta\hat{\omega}_1$ and $\hat{\theta}_1$ are obtained as follows:

$$\Delta\hat{\omega}_1 = \frac{\Sigma\eta_k \Sigma k\eta_k A_k - \Sigma\eta_k A_k \Sigma k\eta_k}{t\{\Sigma\eta_k \Sigma k^2\eta_k - (\Sigma_k \eta_k)^2\}} \quad (29)$$

-continued $$\hat{\theta}_1 = \frac{\Sigma k^2 \eta_k \Sigma \eta_k A_k - \Sigma k \eta_k \Sigma k \eta_k A_k}{\Sigma \eta_k \Sigma k^2 \eta_k = (\Sigma k \eta_k)^2} \quad (30)$$

Figure 3:
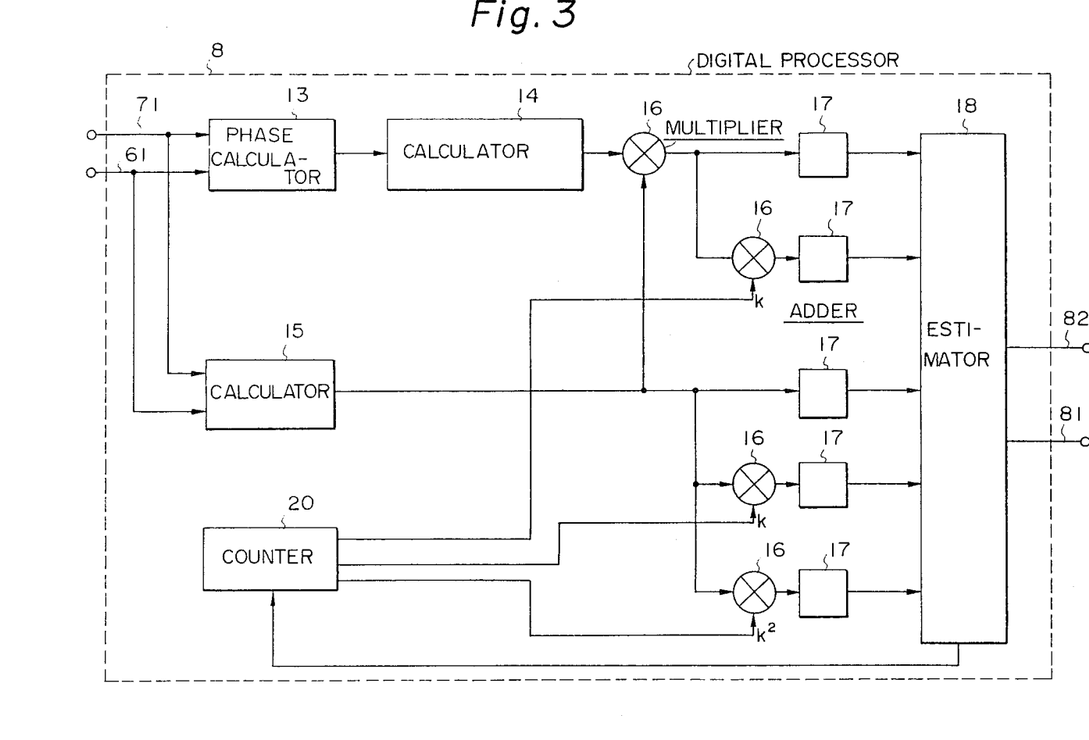
FIG. 3 is a block diagram illustrating an embodiment of a digital calculator for use in the present invention.

The calculations corresponding to Eqs. (29) and (30) are performed by the digital processor 8 shown in FIG. 2. FIG. 3 shows an example of the arrangement of the digital processor 8.

In FIG. 3 the output signals $X_i$ and $Y_i$ for each sample point are provided to the terminals 71 and 61. Reference numeral 13 indicates a phase calculator, 14 a calculator for calculating a net amount of angular rotation, 15 a calculator for calculating the amplitude level of the received signal, 16 multipliers, 17 adders, 18 an estimator for $\Delta\omega$ and $\hat{\theta}$, 20 a data sample number counter, and 81 and 82 output terminals at which $\hat{\theta}$ and $\hat{\Delta\omega}$ estimated by the estimator 18 are provided.

In the digital processor 8 depicted in FIG. 3 the phase calculator 13, the angular rotation amount calculator 14, the amplitude level calculator 15, the multipliers 16 and the adders 17 perform calculations corresponding to elements in Eqs. (15), (16), (14), (29) and (30), respectively, and the estimator 18 calculates $\Delta\omega$ and $\hat{\theta}$ corresponding to Eqs. (29) and (30) through use of the values of the respective elements derived at the output of the adders 17. In this case, $\hat{\Delta\omega}$ and $\hat{\theta}$ obtained at the output terminals 82 and 81 are used to control the VCO 11 and the phase shifter 10 in FIG. 2.

Since the frequency of the VCO 11 is controlled by a voltage value, however, let it be assumed that the output $\hat{\Delta\omega}$ from the digital processor 8 is converted into a voltage value for yielding a frequency having shifted by $\hat{\Delta\omega}$ from the reference carrier $\omega_0$ of the VCO 11, which voltage value is provided via the output terminal 82 to the VCO 11. The phase shifter 11 can be implemented by, for example, a delay line circuit corresponding to a phase difference, and the delay of a delay line, which forms the variable phase shifter 10, is varied in accordance with the output $\hat{\theta}$ from the digital processor 8 to the output terminal 81.

By these operations a signal synchronized in phase with the received signal 1 is provided at the terminal 12.

Figure 4:
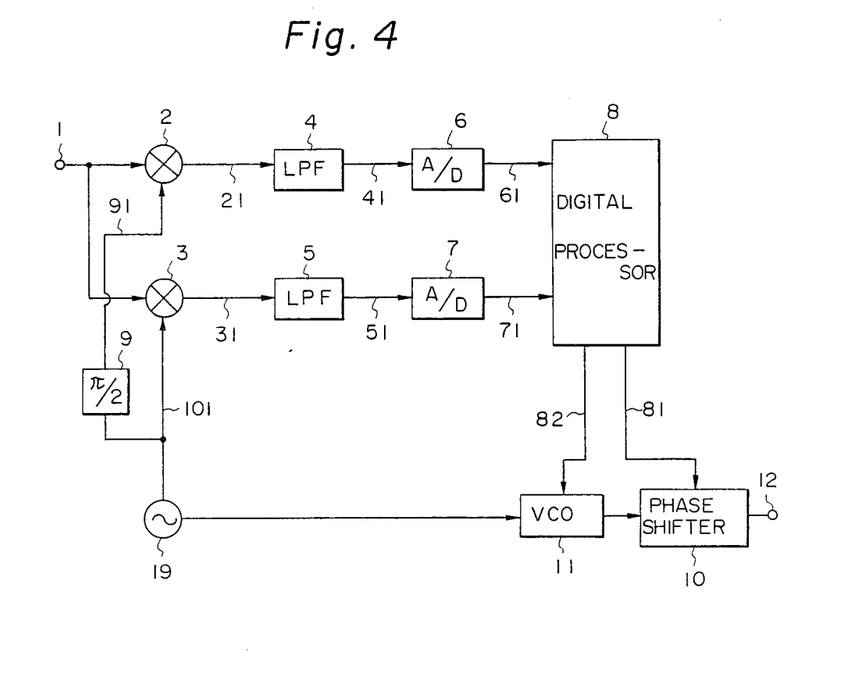
FIG. 4 is a block diagram illustrating an example of a feedforward type phase synchronizatiion circuit of the present invention.

The above has described the feedback type phase synchronization circuit. Next, a description will be given of a second embodiment of the present invention. FIG. 4 illustrates an embodiment of a feedforward type circuit.

The first embodiment is the feedback type phase synchronization circuit in which the frequency difference 82 and the phase difference 81 estimated by the digital processor 8 are fed back to the VCO 11 and the phase shifter 10, respectively, controlling the frequency and the phase of the reference signal itself to be synchronized in phase with the received signal. In contrast thereto, according to the feedforward type circuit shown in FIG. 4, the output of a fixed oscillator 19 is used as a reference carrier, which has a fixed frequency value at all times. The digital processor 8 performs the same processing as described previously with respect to first embodiment, and provides at its outputs 81 and 82 estimated values of the phase and frequency differences between the received signal and the output signal of the fixed oscillator, respectively. The variable phase shifter 10 and the VCO 11 are controlled by the phase difference and the frequency difference obtained at the output terminals 81 and 82, respectively, and a recovered carrier is obtained at the output terminal 12.

The operations described above constitute the basis of the present invention. Next, this phase synchronization circuit will be described as being applied to the case of a TDMA communication in which a plurality of asynchronous signals are received in the form of bursts, or the case where the received signal varies with time according to the condition of the transmission line.

Figure 5:
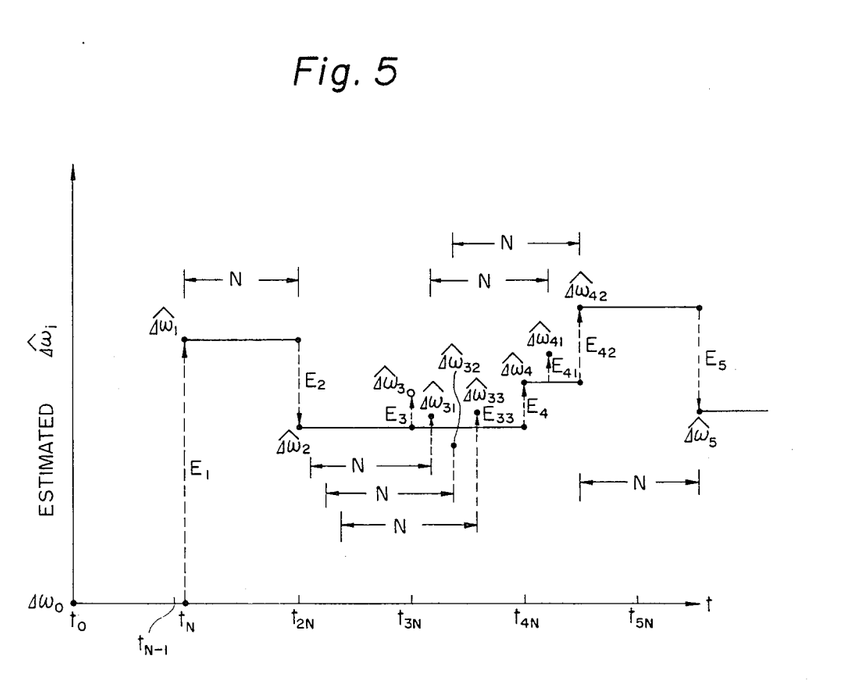
FIG. 5 is a graph showing temporal variations of frequency deviations which are estimated in the application of the phase synchronization circuit of the present invention to the TDMA communication in which a plurality iof asynchronous signals are received in the form of bursts.

FIG. 5 shows, by way of example, temporal variations of the angular frequency deviation ($\hat{\Delta\omega}_i$) estimated by the digital processor 8. The operation of the phase synchronization circuit of the present invention shown in FIG. 2 will be described with reference to FIG. 5.

The frequency difference $\hat{\Delta\omega}_1$ and the phase difference $\hat{\theta}_1$ are estimated using N samples from the time $t_0$ to $t_{N-1}$. In this instance, the difference $E_1$ between the estimated frequency difference $\hat{\Delta\omega}_1$ and the VCO output frequency $\hat{\Delta\omega}_0$ from the time $t_0$ to $t_{N-1}$ is obtained, and the difference $E_1$ is compared with a predetermined threshold value $E_s$. For example, when the difference $E_1$ is greater than the threshold value $E_s$, it is determined that the variation of the received signal is large (corresponding to the pull-in in the case of the TDMA signal), and after the time $t_N$ the oscillation frequency of the VCO 11 is set to $(\omega_0 + \hat{\Delta\omega}_1)$ and the phase of the phase shifter 10 is set to $\hat{\theta}_1$, as shown in Eq. (2).

Next, $\hat{\Delta\omega}_2$ and $\hat{\theta}_2$ are similarly estimated for N samples from the time $t_N$ to $t_{N-1}$, and the difference $E_2$ between $\hat{\Delta\omega}_1$ and $\hat{\Delta\omega}_2$ is obtained and is then compared with the threshold value $E_s$.

FIG. 5 shows the case where the difference $E_2$ is also greater than the threshold value $E_s$ and the oscillation frequency of the VCO 11 is switched to $(\omega_0 + \hat{\Delta\omega}_2)$ at a time $t_{2N}$. FIG. 5 further shows a case where the difference $E_3$ between $\hat{\Delta\omega}_2$ and $\hat{\Delta\omega}_3$ estimated using N samples from the time $t_{2N}$ to $t_{3N-1}$ is smaller than the threshold value $E_s$. In this case, it can be judged that the received signal is stable (in the steady state in the case of the TDMA signal).

In this instance, the oscillation frequency of the VCO 11 after a time $t_{3N}$ is held at $(\omega_0 + \hat{\Delta\omega}_2)$, N samples are taken in after the time $t_{3N}$ and then 2N samples after the time $t_{2N}$ are used to estimate the angular frequency deviation $\Delta\omega$ and the initial phase $\theta$. Such an increase in the number of samples for use in the estimation of the angular frequency deviation $\Delta\omega$ and the initial phase $\theta$ corresponds to the narrowing of the loop band in the PLL system and permits a phase synchronization with a small phase jitter.

In this case, however, to detect an abrupt change of the received signal in the period during which the 2N samples are taken in, $\hat{\Delta\omega}_{31}$ and $\hat{\theta}_{31}$ are also estimated using N samples from a time $t_{2N+1}$ to $t_{3N}$ as shown in FIG. 5. Similarly, $\hat{\Delta\omega}_{32}$ and $\hat{\Delta\omega}_{33}$ are sequentially estimated using data of N continuous samples as in the periods of time from $t_{2N+2}$ to $t_{3N+1}$ and from $t_{2N+3}$ to $t_{3N+2}$, in parallel to the above-mentioned estimating operation using 2N samples.

In this case, the differences $E_{31}$, $E_{32}$, . . . between $\hat{\Delta\omega}_2$ and $\hat{\Delta\omega}_{31}$, $\hat{\Delta\omega}_{32}$, . . . sequentially estimated using the N continuous samples are obtained and they are each compared with the threshold value $E_s$. FIG. 5 shows a case where the differences $E_{31}$, $E_{32}$, . . . , $E_{3,N-1}$ which are obtained in the time interval of N samples from the time $t_{3N}$ to $t_{4N-1}$ are all smaller than the threshold value $E_s$. At a time $t_{4N}$, $\hat{\Delta\omega}_4$ and $\hat{\theta}_4$ estimated using 2N samples from the time $t_{2N}$ to $t_{4N-1}$ are used to control the VCO 11 and the phase shifter 10.

If the system is stable after the time $t_{4N}$, then the phase synchronization takes place every 2N samples through the above-described operations.

For example, an abrupt change of the received signal in case of controlling every 2N samples (corresponding to a change of the burst signal in the case of the TDMA signal) can be detected because the difference $E_{42}$ between $\Delta\hat{\omega}_{42}$ estimated using N samples and $\Delta\hat{\omega}_4$ becomes greater than the threshold value $E_s$ at the time $t_{4N-2}$, as shown in the example of FIG. 5. In this instance, the VCO 11 and the phase shifter 10 are controlled by $\Delta\hat{\omega}_{42}$ and $\hat{\theta}_{42}$ estimated using N samples from the time $t_{3N+1}$ to $t_{4N+2}$, by which the phase synchronization can be achieved following the abrupt change of the received signal.

As described above, according to the phase synchronization circuit of the present invention, it can be determined whether the circuit is in the pull-in or stead-state operation, and the pull-in operation can be achieved rapidly by decreasing the number of samples for use in the estimation of the angular frequency deviation $\Delta\omega$ and the initial phase $\theta$, and during the stead-state operation the number of samples used is increased, thereby permitting a high quality phase synchronization.

On the other hand, the unit sample number for use in the estimation of the angular frequency deviation $\Delta\omega$ and the $\theta$ initial phase (N in the above-described embodiments), the unit sample number for use during the steady-state operation (2N in the afore-mentioned embodiments), and the threshold value $E_s$ of the frequency difference are determined in accordance with the state of the transmission line, the accuracy required of the phase synchronization circuit in view of the entire system, and so forth. These parameters can easily be changed because the estimation operation of the frequency difference and the phase difference is performed by digital processing.

As described above in detail, according to the phase synchronization system of the present invention, the frequency deviation and the phase error between the received signal and the recovered carrier are estimated directly through utilization of the optimization method, and even if the frequency deviation and the phase error are large, they can be obtained accurately. Furthermore, the number of sample data for use in the estimation of the frequency deviation and the phase error by use of the optimization method can be selected at will in accordance with the state of the received signal (during the pull-in or steady state of the TDMA signal, for example). This provides, in the pull-in operation, rapid phase synchronization through use of a small number of data samples and, in the steady-state operation, high-quality phase synchronization through use of a larger number of data samples. The determination of the pull-in and the steady-state operations is made possible by storing the hysteresis of frequency deviations and phase errors estimated in the loop so far.

Moreover, the parameters such as the number of data samples for the estimation can easily be changed from the outside in accordance with the state of the transmission line, and an optimum phase synchronization system can be provided.

I claim:

1. A phase synchronization circuit, characterized in that a received signal is phase-detected by first and second reference carriers orthogonal to each other and controlled by a voltage-controlled oscillator and a phase shifter; two baseband oiutput signals thus obtained are sampled with a certain period and converted from analog values into digital values: phase and amplitude values at each sample point are obtained from these digital values orthogonal to each other; frequency and phase differences between the received signal and each of the first and second reference carriers as estimated by an optimization method through utilization of pluralities of phase and amplitude value data obtained in a fixed period of time; and the voltage-controlled oscillator and the phase shifter are controlled with the estimated values of the frequency and phase differences, thereby generating a recovered carrier of a phase synchronized with the received signal.

2. A phase synchronization circuit according to claim 1, characterized in that a circuit is provided in which the hysteresis of frequency and phase differences estimated is stored at the time of current estimatiion; these stored values and currently-estimated values are compared with each other; the state of the received signal is analogized on the basis of the results of comparison of these values; and the numbers of data samples for use in the estimation of the frequency and phase differences are made variable according to the result of the analogy, thereby achieving an optimum phase synchronization in accordance with the state of the received signal.

3. A phase synchronization circuit, characterized in that a received signal is phase detected by a first reference carrier from a fixed oscillator and a second reference carrier orthogonal to the first reference carrier; two baseband signals thus obtained are sampled with a certain period and converted from analog value into digital values; phase and amplitude values at each sample point are obtained from these digital values orthogonal to each other; frequency and phase differences between the received signal and each of the first and second reference carriers are estimated by an optimization method through utilization of pluralities of phase and appliptude data obtained in a fixed period of time; and the voltage-controlled oscillator and the phase shifter are controlled with the estimated values, thereby generating a recovered carrier of a phase synchronized with the received signal.

4. A phase synchronization circuit according to claim 3, further including a circuit in which the hysteresis of frequency and phase differences estimated is stored at the time of current estimation; these stored values and currently-estimated values are compared with each other; the state of the received signal is analogized on the basis of the results of comparison of these values; and the numbers of data samples for use in the estimation of the frequency and phase differences are made variable according to the result of analogy, thereby achieving an optimum phase synchronization in accordance with the state of the received signal.

5. A phase synchronization circuit comprising, means for receiving a received signal, means for phase-detecting the received signal with two reference carriers orthogonal to each other and developing two baseband signals, a voltage controlled oscillator and a phase shifter for controlling the two reference carriers orthogonal to each other and to generate a carrier of a phase synchronized with the received signal, means receptive of the two baseband signals for sampling thereof and for converting phase and amplitude values obtained at each sample point into digital value signals orthogonal to each other, processor means for estimating frequency and phase differences between the received signal and each of the first and second reference carriers by an optimization method utilizing pluralities of phase and amplitude data obtained for a fixed period of time from the sampling and for controlling the voltage-controlled oscillator and the phase shifter with the estimated values thereby generating said carrier of a phase synchronized with the received signal.

6. A phase synchronization circuit according to claim 5, including means for storing hysteresis of frequency and phase differences at time of current estimation, means for comparing currently the estimated values with each other and for analogizing the received signal on a basis of results of comparison of these values, and means for varying the number of data samples for use in estimation of the frequency and phase differences according to the analogy, thereby achieving an optimum phase synchronization in accordance with the state of the received signal.

7. A phase synchronization circuit comprising, an input terminal for a received signal, means for phase-detecting said received signal by first and second reference carriers and for developing two baseband signals, means for sampling the two baseband signals and for converting the two baseband signals to digital values and obtaining phase and amplitude values at each sample point obtained from the two baseband signals orthogonal to each other, means for estimating by an optimizatioin method frequency and phase differences between the received signal and each of the first and second reference carriers, a voltage-controlled oscillator and a phase shifter controlled with estimated values of said frequency and phase differences and connected to for controlling the first and second carriers and generating a recovered carrier of a phase synchronized with the received signal, and means for taking out the recovered carrier as an output.

8. A phase syncronization circuit comprising, means for receiving a received signal, two multipliers for multiplying the received signal with two reference carriers orthogonal to each other for phase-detecting the received signal and obtaining two baseband signals, means comprising a voltage-controlled oscillator and phase shifter means for controlling application of the two reference carriers to the two multipliers, means comprising two A/D converters for sampling the baseband signals to obtain phase and amplitude values thereof at each sample point and converting the values to digital values orthogonal to each other, means for receiving the digital values for estimating frequency and phase differences between the received signal and each of the first and second reference carriers by an optimization method utilizing pluralities of phase and amplitude value data obtained in a fixed period of time, means connecting the voltage-controlled oscillatior and the phase shifter means for control thereof with said estimated values of the frequency and phase differences, and output means to take out as an output from the voltage-controlled oscillator and the phase shifter means a generated recovered carrier of a phase synchronized with the received signal.

9. A phase synchronization circuit comprising, means for receiving a received signal, means for phase-detecting the received signal with two reference carriers orthogonal to each other and developing two baseband signals, a fixed oscillator and a voltage controlled oscillator and a phase shifter for controlling the two reference carriers orthogonal to each other and to generate a carrier of a phase synchronized with the received signal, means receptive of the two baseband signals for sampling thereof and for converting phase and amplitude values obtained at each sample point into digital value signals orthogonal to each other, processor means for estimating frequency and phase differences between the received signal and each of the first and second reference carriers by an optimization method utilizing pluralities of phase and amplitude data obtained for a fixed period of time from the sampling and for controlling the voltage-controlled oscillator and the phase shifter with the estimated values thereby generating said carrier of a phase synchronized with the received signal.

10. A phase synchronization circuit according to claim 9, including means for storing hysteresis of frequency and phase differences at time of current estimation, means for comparing currently the estimated values with each other and for analogizing the received signal on a basis iof results of comparison of these values, and means for varying the number of data samples for use in estimation of the frequency and phase differences according to the analogy, thereby achieving an optimum phase synchronization in accordance with the state of the received signal.

* * * * *